United States Patent
Maamari et al.

(10) Patent No.: US 6,883,134 B2
(45) Date of Patent: Apr. 19, 2005

(54) METHOD AND PROGRAM PRODUCT FOR DETECTING BUS CONFLICT AND FLOATING BUS CONDITIONS IN CIRCUIT DESIGNS

(75) Inventors: Fadi Maamari, San Jose, CA (US); Sonny Ngai San Shum, San Jose, CA (US)

(73) Assignee: LogicVision, Inc., San Jose, CA (US)

( * ) Notice: Subject to any disclaimer, the term of this patent is extended or adjusted under 35 U.S.C. 154(b) by 740 days.

(21) Appl. No.: 09/817,299

(22) Filed: Mar. 27, 2001

(65) Prior Publication Data

US 2002/0144211 A1 Oct. 3, 2002

(51) Int. Cl.[7] .............................................. G06F 11/00
(52) U.S. Cl. ...................................... 714/811; 714/724
(58) Field of Search ................................. 714/811, 724, 714/711; 711/151; 716/1; 710/107, 113; 327/291

(56) References Cited

U.S. PATENT DOCUMENTS

| | | | |
|---|---|---|---|
| 5,214,769 A | * | 5/1993 | Uchida et al. ............... 711/151 |
| 5,373,514 A | | 12/1994 | Ma et al. |
| 5,420,871 A | | 5/1995 | Maamari et al. |
| 5,513,124 A | | 4/1996 | Trimberger et al. |
| 5,513,190 A | | 4/1996 | Johnson et al. |
| 5,566,187 A | | 10/1996 | Abramovici et al. |
| 5,572,535 A | | 11/1996 | Pixley et al. |
| 5,594,891 A | * | 1/1997 | Koseko ............................ 716/1 |
| 5,872,936 A | * | 2/1999 | Eckstein ....................... 710/107 |
| 6,016,564 A | | 1/2000 | Hosokawa |
| 6,038,392 A | | 3/2000 | Ashar et al. |
| 6,121,814 A | * | 9/2000 | Henry ........................... 327/291 |
| 6,560,663 B1 | * | 5/2003 | Logsdon et al. ............. 710/113 |

OTHER PUBLICATIONS

Fujiwara et al., "On the Acceleration of Test Generation Algorithms", IEEE Transactions on Computers, vol. C–32, No. 12, Dec., 1983.

Koseko et al., Tri–state Bus Conflict Method for ATPG Using BDD, 1993, IEEE.

Roth et al., "Programmed Algorithms to Compute Tests to Detect and Distinguish Between Failures in Logic Circuits", IEEE Transactions On Electronic Computers, Oct. 1967.

\* cited by examiner

Primary Examiner—David Ton
(74) Attorney, Agent, or Firm—Eugene E. Proulx

(57) ABSTRACT

A method and program product for verifying a logic design for proper operation of tri-state buses in the design, comprises, for each bus in the circuit design, determining the smallest cut set, a min-cut, of the logic controlling the bus, performing an exhaustive analysis on a min-cut set of logic, and performing a full exhaustive analysis of the bus when the exhaustive analysis on the min-cut set of logic is inconclusive. In a preferred embodiment, prior to performing the min-cut set analysis, implication based conflict-free and float-free analyses are performed on the bus.

76 Claims, 10 Drawing Sheets

METHOD AND PROGRAM PRODUCT FOR DETECTING BUS CONFLICT AND FLOATING BUS CONDITIONS IN CIRCUIT DESIGNS

The present invention relates to a method and program product for verifying logic circuit designs, and, more specifically, to a method and program product for verifying proper operation of tri-state buses in circuit designs.

BACKGROUND OF THE INVENTION

Tristate logic is often used in large scale integrated logic circuits, usually to implement a multiplexing function with smaller area and delay. The drawback of using tri-state logic gates in logic design is that extra precautions need to be taken to prevent the occurrence of either of the following conditions during circuit operation: Condition 1: a "bus-conflict" condition in which two or more of the tri-state elements driving the bus are active at the same time; and Condition 2: a "floating bus" condition in which all of the tri-state elements driving the bus are inactive. Both conditions are undesirable in large scale integrated circuits because they can result in a) excessive levels of power consumption and b) unknown logic values that can interfere with chip testing techniques that capture and compress circuit values into a signature register. A number of methods have been developed to test for proper bus operation in semiconductor devices.

Ma U.S. Pat. No. 5,373,514 granted on Dec. 13, 1994 for "Three-State Bus Structure and Method for Generating Test Vectors While Avoiding Contention and/or Floating Outputs on the Three-State Bus" describes a method for generating test vectors that will not put tri-state buses in a conflicting or floating condition. However, the method does not identify tri-state buses that will be conflict-free and floating-free under any combination of circuit inputs.

Maamari et al U.S. Pat. No. 5,420,871 granted on May 30, 1995 for "Method for Maintaining Bus Integrity During Testing" describes a different method for generating test vectors that will not put tri-state buses in a conflicting condition. As a preliminary step in the method, an implication-based procedure is performed to identify tri-state buses that are conflict-free under any combination of circuit inputs. While efficient, the procedure is not always conclusive, i.e. it may fail to identify some conflict-free tri-state buses.

Koseko et al in a paper entitled "Tri-State Bus Conflict Checking Method for ATPG Using BDD", published in the Proceedings of the 1993 International Conference on Computer-Aided Design, pp 512–515, propose a method using Binary Decision Diagrams (BDDs) to identify tri-state buses that are conflict-free and floating-free under any combination of inputs. The method is conclusive, however BDDs are known to explode in size in the presence of some circuit structures such as multipliers, thus requiring excessive amounts of processing to come to a conclusion.

Pixley et al U.S. Pat. No. 5,572,535 granted on Nov. 5, 1996 for "Method and Data Processing System for Verifying the correct operation of a Tri-State Multiplexer in a Circuit Design" improved on the Koseko et al. approach by using cut sets to reduce BDD sizes. However, in many cases, the selected cut set yields inconclusive results requiring the BDDs to be re-evaluated for several cut sets before a conclusion can be reached, thereby offsetting the benefits of having smaller BDDs. Consequently, there continues to be a need for better and alternate solutions to the problem of conclusively identifying tri-state buses which violate the aforementioned conflict-free and floating-free conditions.

SUMMARY OF THE INVENTION

The present invention seeks to provide a method of quickly, efficiently and conclusively determining whether a bus in a circuit is conflict-free and floating-free under any input combination to the circuit.

The present invention provides a min-cut exhaustive analysis which is capable of conclusively identifying buses which are both conflict-free and floating-free. The amount of processing required for this analysis depends more on the number of inputs of the cone of logic being analyzed than on the size of the logic cone. This analysis is shorter and faster than a full exhaustive analysis and requires the evaluation of only one cut set of logic, the min-cut set, which controls the enable inputs of the tri-state gates driving the bus. For cases in which the min-cut set analysis is inconclusive, the present invention provides a full exhaustive analysis.

In a preferred embodiment, the present invention proposes an implication-based analysis which precedes the min-cut analysis as a first iteration in identifying tri-state buses that are conflict-free and floating-free under any input combination to the circuit. The implication-based method is efficient and conclusive in many cases, and is relatively easily evaluated. This step eliminates the need for the more extensive analysis which is or would otherwise be employed.

In accordance with one aspect of the present invention, there is provided a method of verifying a logic design for proper operation of tri-state bus specified in the design, the method comprising, for each bus in the circuit design, performing an exhaustive analysis on a min-cut set of logic controlling the bus and performing a full exhaustive analysis of the bus when the min-cut exhaustive analysis is inconclusive.

Another aspect of the present invention relates to a program product for performing the method of the present invention.

BRIEF DESCRIPTION OF THE DRAWINGS

These and other features of the invention will become more apparent from the following description in which reference is made to the appended drawings in which.

DETAILED DESCRIPTION

Figure 1:
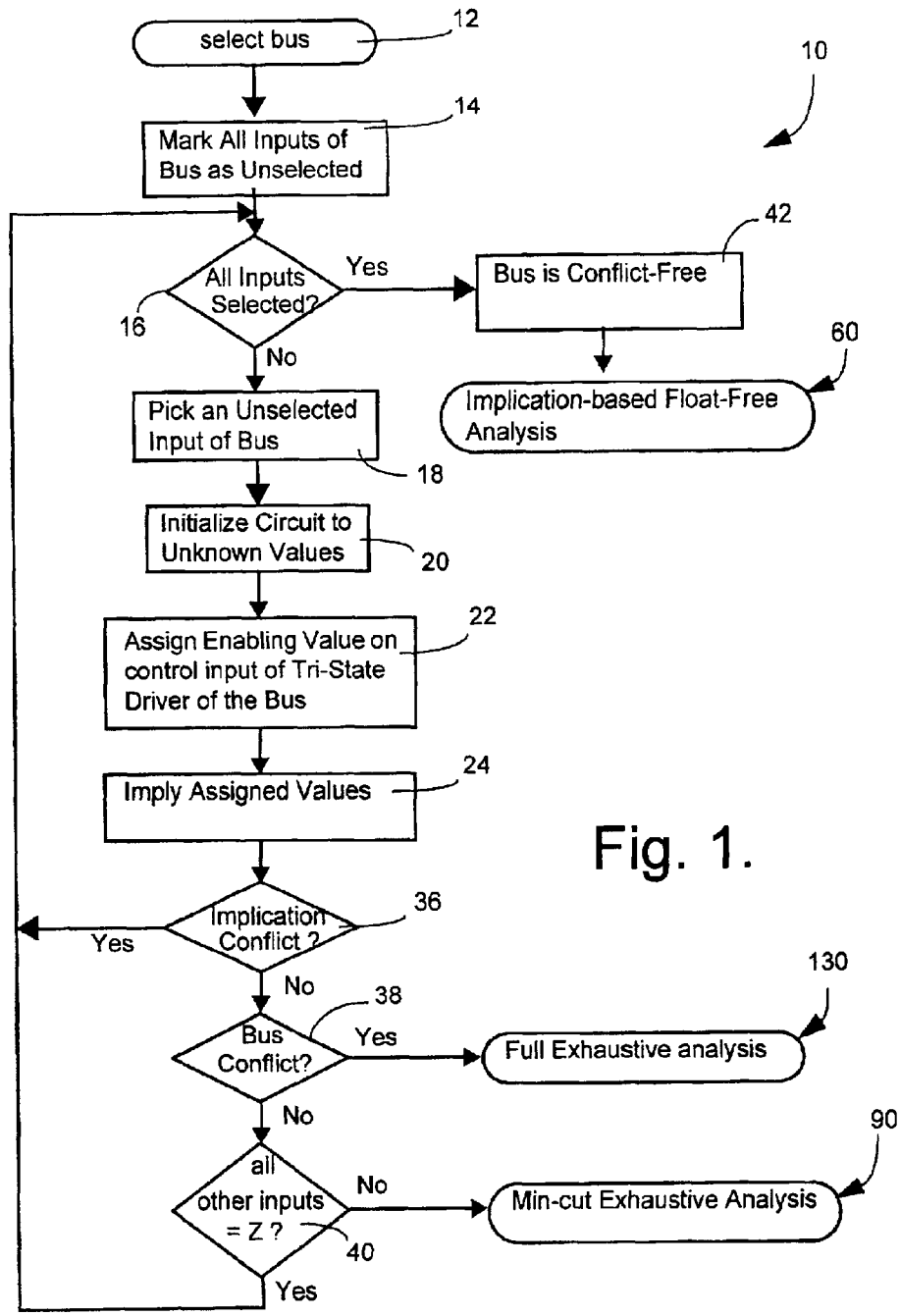
FIG. 1 is a flow chart illustrating an implication-based conflict-free tri-state bus identification method according to an embodiment of the present invention.

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

As is known in the art, integrated circuit devices are typically designed and fabricated using one or more computer data files, referred to herein as hardware definition programs, that define the layout of the circuit arrangements on the devices. The programs are typically generated by design tools and are subsequently used during manufacturing to create layout masks that define the circuit arrangements applied to a semiconductor wafer. Typically, the programs are provided in a predefined format using a hardware definition language (HDL) such as VHDL, verilog, EDIF, etc. While the invention has and hereinafter will be described in the context of fully functioning integrated circuit devices and data processing systems utilizing such devices, those skilled in the art will appreciate that the various embodiments of the invention are capable of being distributed as a program product in a variety of forms, and that the invention applies equally thereto regardless of the particular type of signal bearing media used to actually carry out the distribution. Examples of signal bearing media include but are not limited to recordable type media such as volatile and non-volatile memory devices, floppy disks, hard disk drives, CD-ROM's, and DVD's, among others and transmission type media such as digital and analog communications links.

Generally, the method of verifying the operation of tri-state buses in a circuit according to the preferred embodiment of present invention comprises the following steps for each bus in the circuit: first, an implication based analysis is performed; second, a min-cut exhaustive analysis is performed if the implication based analysis fails to determine conclusively that the bus under test is conflict-free or float free; and, third, a full exhaustive analysis is performed when the min-cut exhaustive analysis also fails to determine conclusively that the bus under test is conflict-free or float-free. The method identifies each bus that is not both conclusively conflict-free and conclusively float-free under any input combination to the circuit. The present invention also contemplates an embodiment comprised of only the min-cut exhaustive analysis; another embodiment comprised only of the implication based analysis and the min-cut exhaustive analysis; and still another embodiment comprised of the combination of the min-cut analysis and the full exhaustive analysis.

The implication based analysis includes a conflict-free analysis and a float-free analysis. Generally, the conflict-free analysis of a bus comprises, for each input of the bus, implying logic values to signals which control the control input of the tri-state driver which produces the selected input so as to produce a driver enabling control value. The bus is designated conclusively conflict-free when the implication of each input results in either an implication conflict or, if no implication conflict, in all other inputs being in a high impedance state. Thus, the number of implication iterations performed in this analysis is equal to the number of inputs to the bus under test.

The implication based float-free analysis is based on the assumption that the bus is in floating condition in which all inputs are inactive. Thus, the analysis implies logic values to signals, which control the control input of the tri-state drivers of the bus, so to produce a disabling control value, or inactive value, at all of the control inputs. An implication which fails, i.e., when there is an implication conflict, means that the underlying assumption that the bus is floating is incorrect. Therefore, the bus is designated conclusively float-free. It will be seen that this analysis involves only a single pass.

The two implication based analyses may be performed in either order. The conflict-free analysis may be performed before or after the float-free analysis. In both cases, except as noted below, if the bus under test fails the implication based analysis, a min-cut exhaustive analysis is performed.

Generally, the min-cut exhaustive analysis involves assigning different combinations of logic values to the inputs of the min-cut subset of logic which drives the control/select input of all of the tri-state drivers of the bus and, for each combination, forward simulating the logic values to the enable input of the bus drivers. The bus is designated as conclusively float-free and conflict-free when no bus conflicts have been detected after all desired combinations of logic values have been applied. The combinations of logic values may be generated by a pseudo-random pattern generator or by a counter, both well known to those skilled in the art.

Generally, the full exhaustive analysis is substantially the same as the min-cut analysis except it is not limited to the min-cut subset of logic, but, rather, includes all inputs in the fan-in or logic cone of the control input of the bus drivers. Each of the three analyses will now be described in detail.

Implication Based Conflict-Free Analysis

Figure 5:
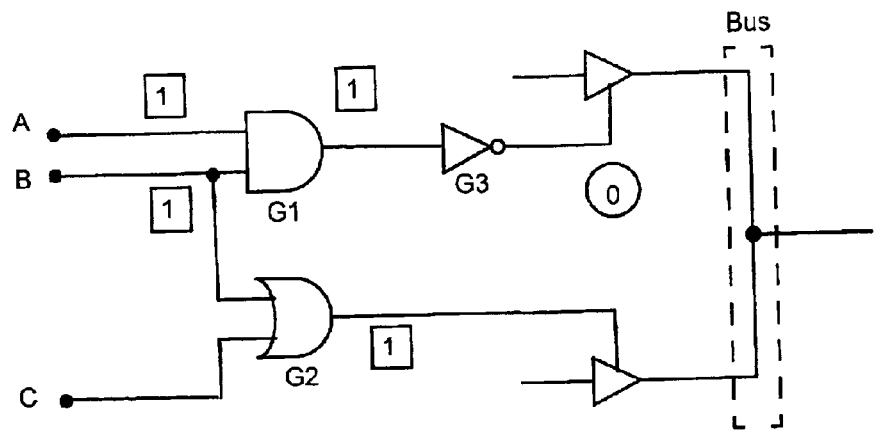
FIG. 5 illustrates a bus and associated control logic to demonstrate an logic value implication procedure.

The implication based analyses will now be described with reference to the flow charts of FIGS. 1 and 2 and the sample circuit of FIG. 5. FIG. 1 is a flow chart 10 of a implication based conflict-free analysis. As indicated above, the conflict-free analysis of a bus involves, for each input of the bus under test, implying logic values to signals which control the control input of the tri-state driver which produces the selected input so as to produce an enabling value on the control input. The bus is designated conclusively conflict-free when the implication of each input results in either an implication conflict or, if no implication conflict, in all other inputs being in a high impedance state.

Figure 9:
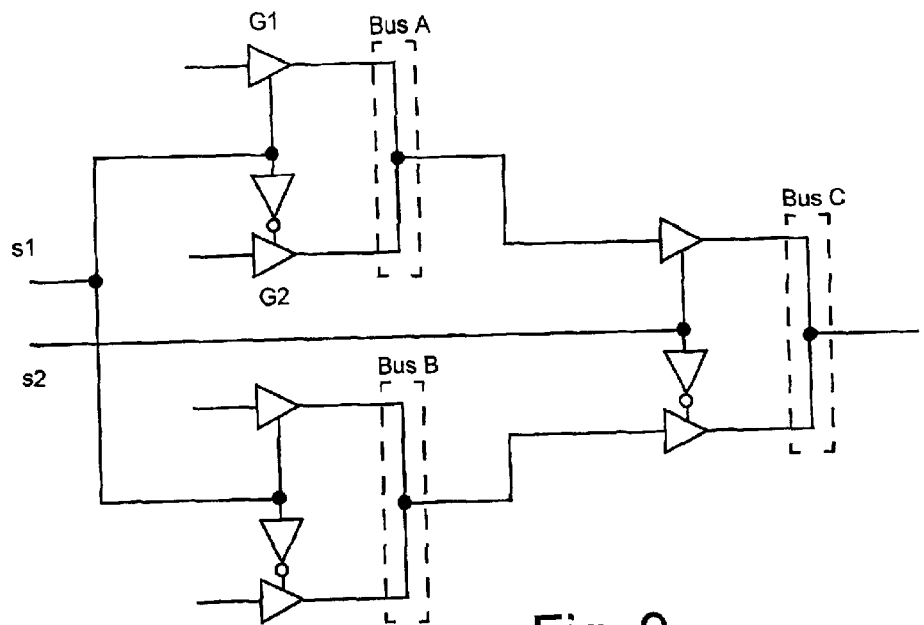
FIG. 9 illustrates the 4-to-1 Multiplexer (MUX) formed with cascaded buses.

Many logic circuits include cascaded or nested buses, as illustrated in FIG. 9, in which one or more buses, such as buses A and B, are located in the logic cone of another bus, such as bus C. The buses in the logic cone of other buses must be analyzed first. If a bus is not fully decoded, buses in the fan-out of the bus may be proven fully decoded, but, that cannot be considered conclusive if there is bus in their fan-in that is not fully decoded. Accordingly, such buses should be repaired first and downstream buses re-analyzed before any repairs are considered for downstream buses. Thus, prior to initiating the process, all buses in the circuit are identified and arranged in an ordered list with buses which are in the fan-in of other buses appear earlier in the list. The buses are then analyzed one at a time in the order in which they appear in the list. Step 12 is the first step and involves selecting a bus for analysis.

Each input of the selected bus is analyzed individually. Thus, at step 14, all bus inputs are initially designated as being unselected. Step 16 determines whether all inputs of the selected bus have been analyzed. If not, step 18 selects an input for analysis. Step 20 initializes the circuit to unknown values so as to remove any residual signals which may have been generated in a previous test.

Step 22 assigns an enabling value on the control input of the of the tri-state gate connected to the selected input of the selected bus and step 24 implies logic values to signals which control the control input of the tri-state gate. It would be useful at this point to describe the implication procedure in general terms.

The assignment of a logic value in a circuit implies the presence of other values in the circuit. The implications or implied values are deduced from the circuit logic. The procedure will be better understood by reference to FIG. 5, in which assigned logic values are circled and implied logic values are surrounded by a square. A logic 0 is assigned on the output of G3. The logic 0 "implies" a logic 1 on its input because G3 is an inverter. Similarly, a logic 1 on the output of G1, an AND gate, implies a logic 1 on inputs A and B of the AND gate. The logic 1 on input B implies a logic 1 on the output of G2. Implications may propagate both backward and forward one or more times in a circuit. The Implication procedure continues until no further implications can be performed. Implication is usually event-driven. This means that a gate is queued for evaluation/implication when a new value is assigned or implied on its output or on one of its inputs.

An "implication conflict" occurs when both a logic 1 and a logic 0 are implied on the same net of the circuit. An implication conflict implies that the initial assignments are inconsistent with the function of the circuit.

Figure 6:
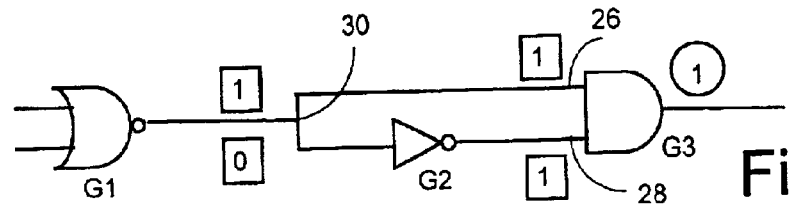
FIG. 6 illustrates a circuit which is used herein to demonstrate an Implication conflict.

An example of an implication conflict is shown in the circuit of FIG. 6. A logic 1 is assigned to the output of G3. This assignment implies a logic 1 on both inputs 26 and 28 of G3 and a logic 1 on the output of G2. Since G2 is an inverter, the logic 1 on its output implies a logic 0 on its input. However, input 28 of G3 and the input of G2 are both connected to common node 30. Therefore, the logic 1 initially assigned to the output of G3 is inconsistent with the circuit function. However, a logic 0 assigned to the output of G3, implies G3 inputs of [1,0] or [0,1]. In both of these cases, no implication conflict occurs at common node 30.

Figure 4:
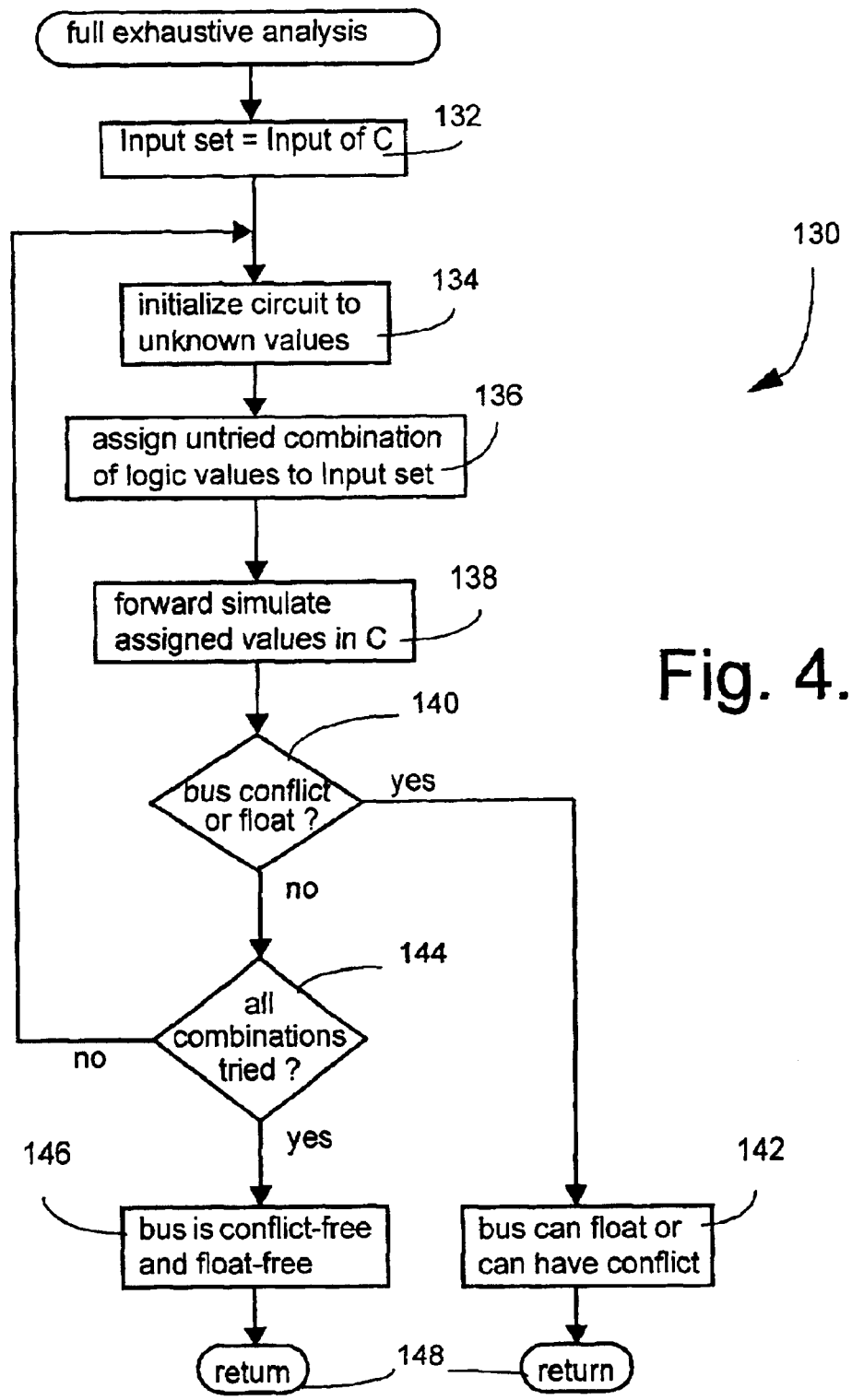
FIG. 4 is a flow chart illustrating a full exhaustive of tri-state bus of a tri-state bus analysis method according to an embodiment of the present invention.

Returning to FIG. 1, and referring to comparing step 36, an implication which results in an implication conflict implies that the selected input is always disabled. When the implication does not result in an implication conflict, step 38 determines whether a bus conflict exists by considering the values on all of the inputs of the bus resulting from the implication procedure. A bus conflict exists if two or more bus inputs are active, i.e. conditions 1 is not satisfied. When a bus-conflict does exist, a full exhaustive analysis 130, illustrated in FIG. 4, is performed. That analysis is described later. It will be noted that a min-cut exhaustive analysis could be performed at this stage instead of the full exhaustive analysis. However, if a bus conflict is identified during the implication based analysis, there is a high likelihood that the min-cut analysis will identify a bus conflict as well. This then implies there is high likelihood it will be necessary to perform the full exhaustive analysis in any case. Thus, the time spent performing the min-cut analysis may be wasted time.

If no bus conflict is identified, step 40 determines whether all other inputs on the selected bus are in a high impedance (Z) state. If not, processing branches to the min-cut exhaustive analysis 90 illustrated in FIG. 3 and described later. Otherwise, processing returns to step 16. Step 16 determines whether all inputs of the bus have been analyzed. If not, another input is selected and the procedure is repeated. If so, then step 42 designates the bus as conclusively conflict-free and processing proceeds to the implication based float-free analysis 60 illustrated in FIG. 2.

Implication Based Floating-Free Analysis

As indicated above, the implication based float-free analysis 60 involves implying logic values to signals which control the control/select input of the tri-state drivers that produce a disabling control value on all of the control inputs. Thus, the bus is assumed to be floating. An implication which results in an implication conflict, means that the underlying assumption (the bus is floating) is incorrect and that, therefore, the bus is not floating. Such a bus is designated conclusively float-free.

Figure 2:
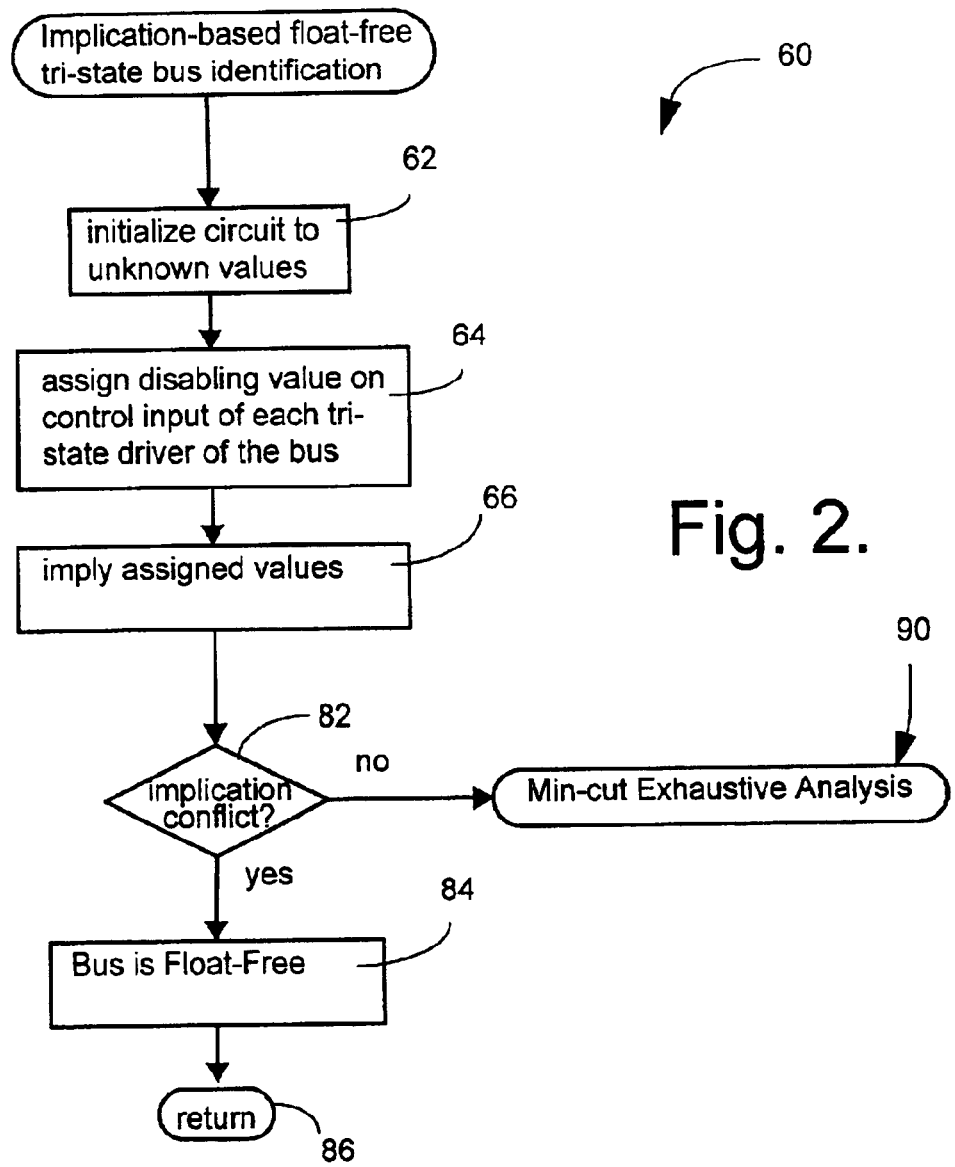
FIG. 2 is a flow chart illustrating an implication-based float-free tri-state bus analysis method according to an embodiment of the present invention.

Referring to FIG. 2, step 62 initializes the circuit to unknown values. Step 64 assigns a disabling value on the control input of each of the inputs of the selected bus and step 66 implies logic values to the signals which control the control inputs. This step may be better understood with reference to FIG. 7.

Figure 7:
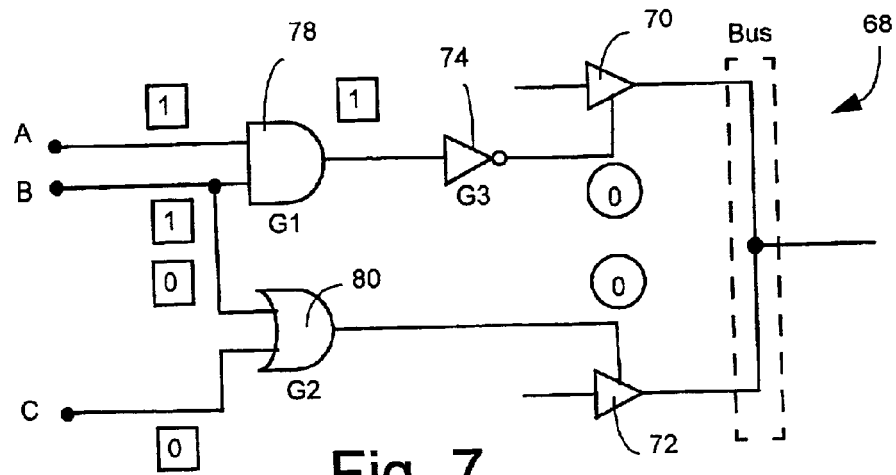
FIG. 7 illustrates a bus and associated control logic used herein to demonstrate an Implication conflict-free analysis according to an embodiment of the present invention.

FIG. 7 illustrates example circuit having a bus 68, two tri-state gates or drivers 70 and 72, an inverter 74 whose output is connected to the enable input of gate 70 and whose input is connected to the output of an AND gate 78. The enable input of gate 72 is connected to the output of OR gate 80. In order to assume the bus 68 to be floating, a logic 0 is assigned on the enable inputs of gates 70 and 72 and, thus, on the outputs of both inverter 74 and OR gate 80. An implication conflict ensues on input B, because gate 78 requires a logic 1 on both of its inputs and gate 80 requires a logic 0 on both of its inputs. As mentioned earlier, the implication procedure is performed both backward and forward as is appropriate until no further implications can be done.

Step 82 determines whether the implication results in an implication conflict. If the implication does not result in an implication conflict, a potential problem exists . Step 82 branches to the min-cut analysis 90 illustrated in FIG. 3 and described below. If an implication conflict does exist, step 82 branches to step 84 which designates the bus as being conclusively float-free. Step 86 returns the process back to step 12 in FIG. 1 where another bus is selected and the implication based conflict-free analysis is performed.

The implication based analyses require less processing than that of a min-cut or full exhaustive analysis. Thus, the amount of processing required to analyze a circuit model is reduced when a bus under test passes both of the implication based analyses.

Min-Cut Exhaustive Analysis

Figure 3:
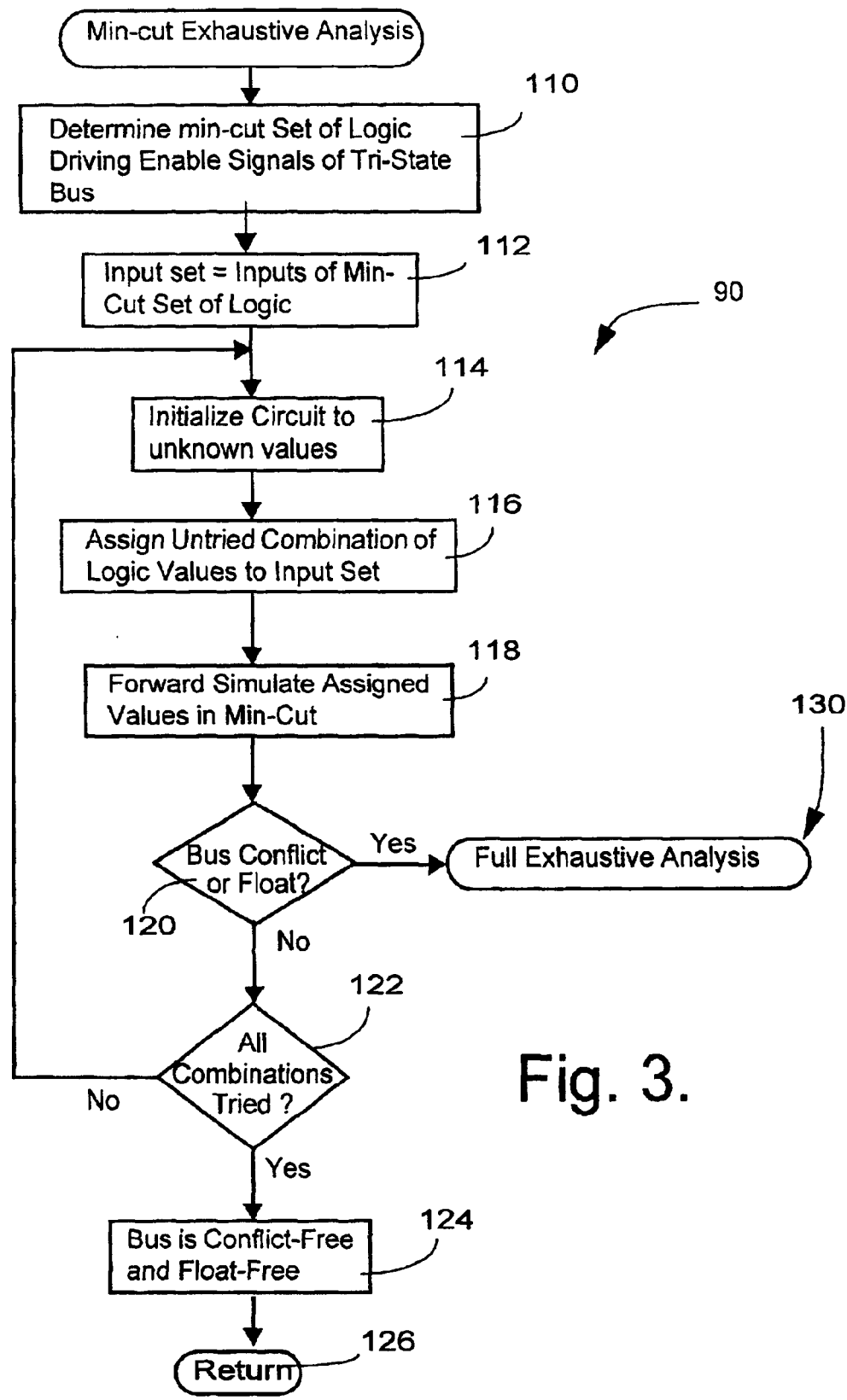
FIG. 3 is a flow chart illustrating a min-cut exhaustive analysis method of a tri-state bus according to an embodiment of the present invention.

Reference will now be made to FIG. 3 illustrates the min-cut exhaustive analysis 90. As mentioned above, the min-cut exhaustive analysis comprises assigning untried or different combinations of logic values to inputs of a min-cut subset of the logic which drives the control/select input of all tri-state drivers of the bus under test and then forward simulating the logic values to the enable input of the drivers. A bus is designated as conclusively float-free and conflict-free when no conflict or floating conditions result from the forward simulation of the assigned logic values.

Figure 8:
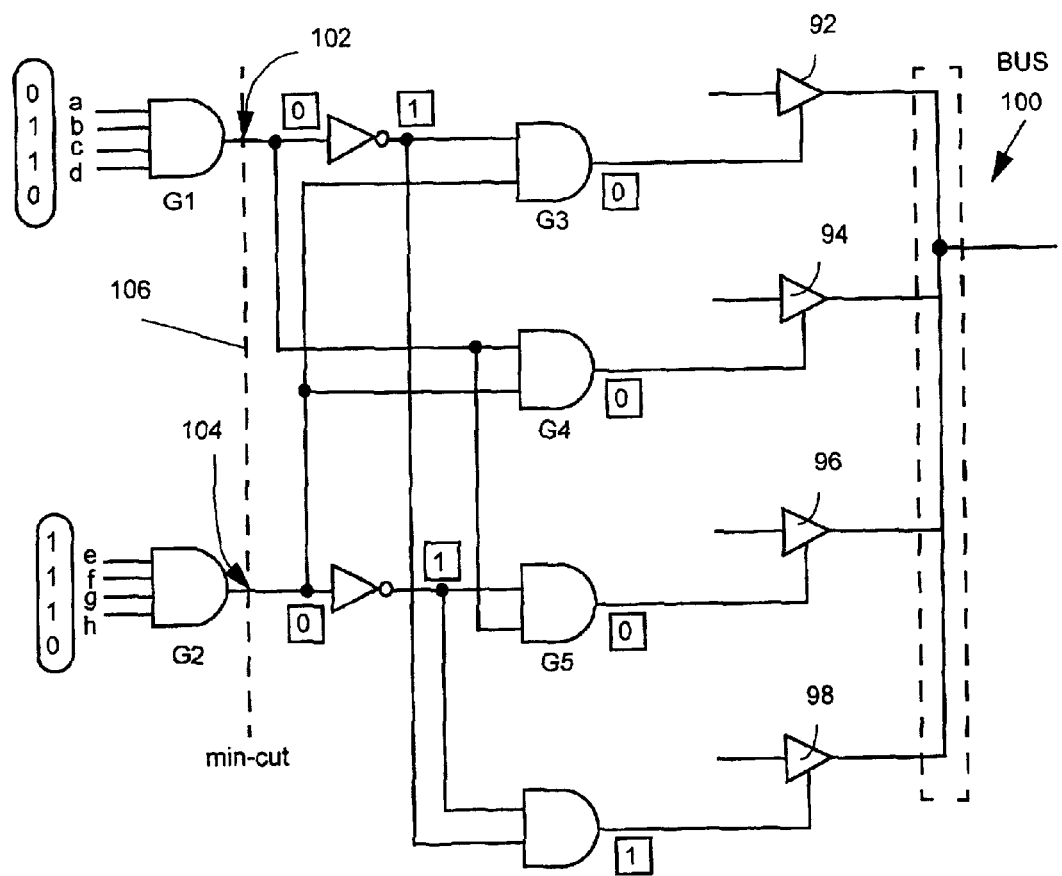
FIG. 8 illustrates a bus and associated control logic for demonstrating a forward simulating procedure for use in the min-cut set and full exhaustive analyses according to an embodiment of the present invention.

A "cut set" is defined as a set of gates that separates a circuit into two parts and such that all paths between a gate located in one part and a gate located in the other part pass through a gate in the cut set of gates. A "min-cut set" is defined as the cut set with the smallest size. In the circuit of FIG. 8, elements G1 and G2 form a min-cut set for a cone of logic which drives the enable inputs of the tri-state gates 92, 94, 96, and 98 of a bus 100. Performing an exhaustive analysis using the min-cut set of the logic cone as an input set can identify a conflict-free and float-free bus with much less processing than if the actual inputs of the cone are used. This is because the number of input combinations that need to be analyzed and the area of the cone in which logic simulation needs to be performed are smaller. In the example circuit of FIG. 8, the size of the min-cut set is two, determined by vertices 102 and 104 which intersect min-cut line 106. Thus, a total of only four input combinations need to be analyzed to identify the bus as conclusively conflict-free and float-free. The input combinations refer to the outputs of gates G1 and G2, which form the min-cut set of gates. The specific combinations in the example of FIG. 8 are (1,0), (1,1), (0,0), and (0,1). If the actual inputs of the cone are used (there are eight of them), the number of combinations which must be considered is 256.

There are various ways of finding a min-cut in the logic cone driving the enables of a bus, with various degrees of complexity. One approach is to use the fact that, in most fully decoded buses (conflict-free and float-free), each vertex in the min-cut set has the property that there is a path between the vertex and the enable line of every tri-state element driving the bus. Vertices with this property can be identified with a single backward traversal of the logic cone. Referring to FIG. 8, the outputs of G1 and G2 are the vertices of the min-cut set. An inspection of the figure reveals that there is a path from the output of each of G1 and G2 to the enable input of each of drivers 92, 94, 96, and 98.

The min-cut algorithm described above, and numerous variations thereof, are well known to those of skill in the art and is more fully described in various publications, such as Kernigham, et al. "An Efficient Heuristic Procedure for Partitioning Graphs," Bell System Technical Journal, 49:291–307 (Feb. 1970), and Krishnamurthy, "An Improved Min-Cut Algorithm for Partitioning VLSI Networks, IEEE Transactions on Computer, C-33(5):438–446 (May 1984), all of which are hereby incorporated by reference. While a preferred embodiment of the method is described herein, variations of the min-cut analysis can be derived to address certain circuit characteristics, or to take advantage of new cut-set techniques as well as improved implication or simulation techniques. Such variations are nonetheless based on the principles of this method, notably the use of implication techniques to identify non-floating buses and exhaustive techniques to identify conclusively both non-floating buses and non-conflicting buses.

Referring to FIG. 3, step 110 traces the cone of logic which drives the enable signals of the tri-state drivers to identify the min-cut set for the selected bus. Step 112 identifies the inputs or vertices of the min-cut set identified in step 110 and all of the possible combinations of logic values which can be applied to the inputs of the min-cut set of logic. Step 114 initializes the circuit to unknown values. Step 116 assigns an untried combination of logic values to the inputs of the min-cut set. Step 118 forward simulates the assigned values into the min-cut set logic to the enable inputs of the bus drivers, and thereby determining the logic values applied to the bus.

Step 120 determines whether a bus conflict and a floating condition exists. If either condition exists, step 120 terminates the procedure and branches to full exhaustive analysis 130 of FIG. 4. It will be understood that, when the set of min-cut inputs is the same set of inputs to the cone of logic driving the bus input enables, there is no need to perform the full exhaustive analysis. Rather, the bus can be conclusively declared as a conflict or floating bus at this point. It will also be understood that the full exhaustive analysis need not be performed at this point should it be desired not to do so. In the vast majority of cases, the full-exhaustive analysis will simply confirm the results obtained from step 120. Thus, one can choose to skip the full exhaustive analysis step in order to save time. If step 120 does not determine that a bus conflict or a floating condition exists, step 120 branches to step 122. Step 122 determines whether all input combinations have been evaluated. If not, the procedure returns to step 114. Steps 114, 116, 118 and 120 are repeated until all input combinations has been evaluated. If the procedure reaches step 122 with all input combinations being evaluated, step 124 is executed. Step 124 designates the bus as conclusively conflict-free and float-free. Step 126 directs the procedure to step 12 in FIG. 1 which selects another bus for analysis or, if all busses have been analyzed, terminates the procedure and produces an analysis report.

In summary, the min-cut exhaustive analysis reduces the amount of processing which would be required if a full exhaustive analysis were performed.

Full Exhaustive Analysis

The full exhaustive analysis 130 is essentially the same as the min-cut analysis except that the analysis is not limited to the min-cut set logic of a bus, but rather extends to the entire cone of logic driving the bus. Thus, referring to FIG. 4, step 132 traces the cone of logic which drives the enable inputs of the tri-state drivers, identifies the inputs of the logic cone and all of the possible combinations of logic values which can be applied to the inputs of the logic cone.

Step 134 initializes the circuit to unknown values. Step 136 assigns an untried combination of logic values to the inputs of the logic cone and step 138 forward simulates the assigned values into the logic cone to the enable inputs of the bus drivers, allowing the logic values applied to the bus to be determined. Step 140 determines whether a bus conflict or a floating condition exists and, If so, branches to step 142 where the bus is declared as having a bus conflict or a floating condition which must be rectified. If not, step 140 branches to step 144. Step 144 determines whether all input combinations have been evaluated. If not, the procedure is returned to step 134 and steps 134, 136, 138 and 140 are repeated with another set of input combination. The procedure is repeated until all input combinations has been evaluated. When all input combinations have been tried, step 144 branches to step 146. Step 146 declares the bus conclusively conflict-free and float-free. Following completion of steps 142 and 146, step 148 returns the procedure to step 12 in FIG. 1 at which another bus is selected or, if all buses have been analyzed, the procedure ends.

Figure 10:
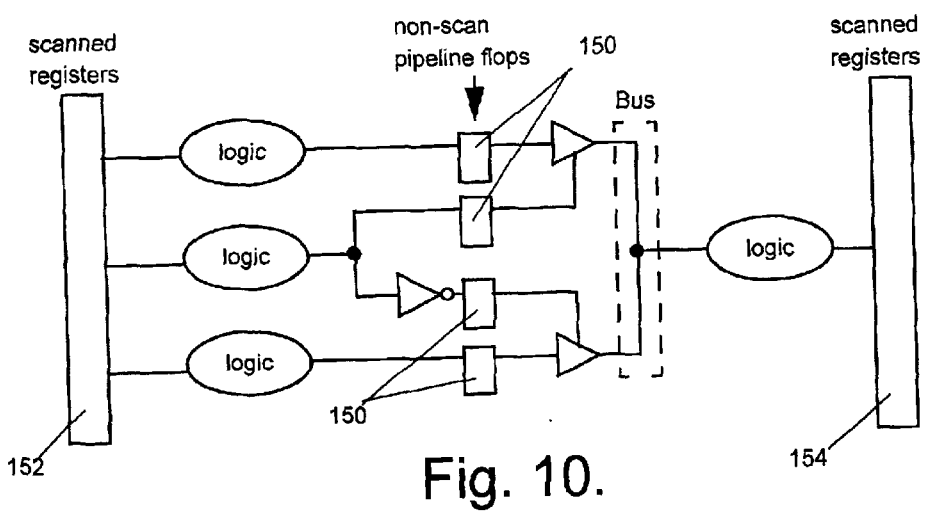
FIG. 10 illustrates the non-scan pipeline flop design.

In some designs, as shown in FIG. 10, non-scan pipeline flops 150 are provided between scannable registers 152 and 154 to achieve higher performances. In the method presented herein the non-scanned pipeline flops are mapped into buffers before analyzing the buses. This is referred to as "pipelined decoding".

Figure 11:
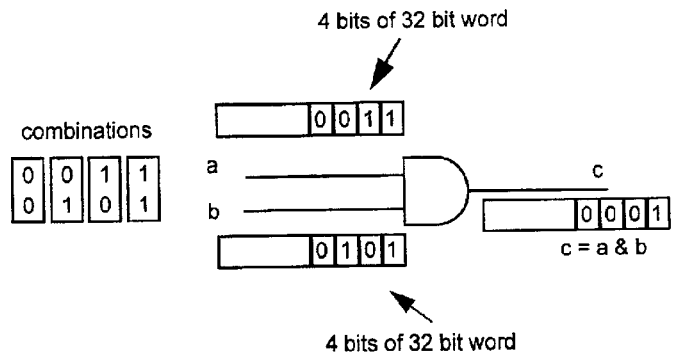
FIG. 11 illustrates a parallel pattern evaluation process according to an embodiment of the present invention.

The forward logic simulation during the min-cut and full exhaustive analyses can be made more efficient by using a parallel pattern evaluation technique, in which multiple combinations are evaluated simultaneously by using each bit of an integer to store one combination. In a 32 bit computer, 32 combinations can be evaluated at once. This is illustrated in FIG. 11, where all four possible combinations of inputs 'a' and 'b' are evaluated at once by performing a bit-wise AND evaluation on a 32-bit computer.

A circuit can be constrained by the application of constant logic values on some of its inputs. Such values should be assigned and propagated in a pre-processing step and kept constant throughout the analysis. More specifically, the constant logic values should not be changed in the step of initializing circuit to unknown values of FIGS. 1–4.

Detailed Example

Figure 12:
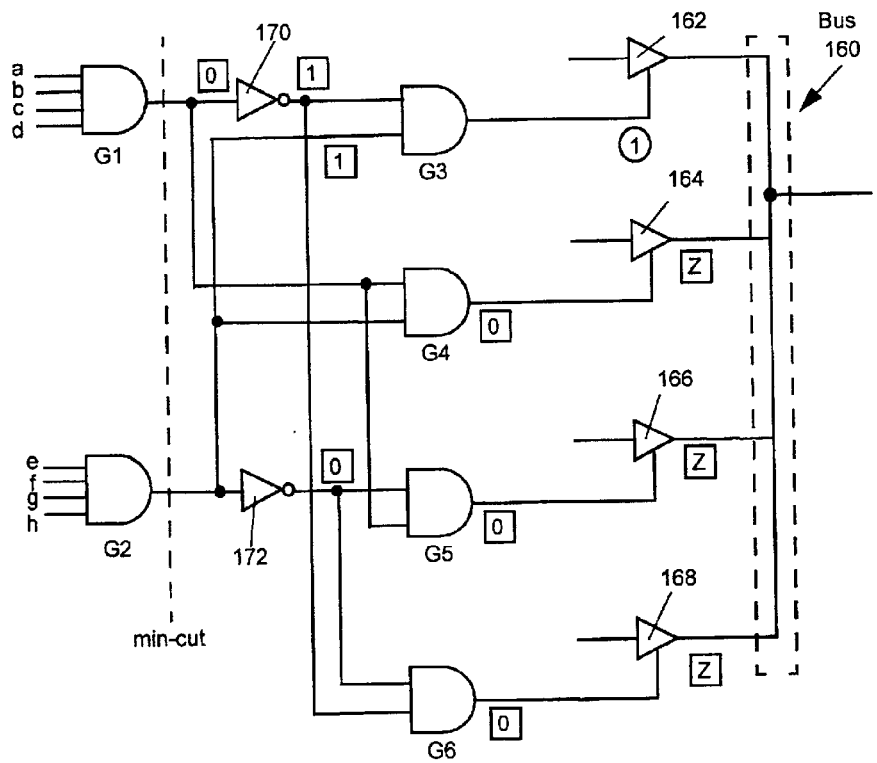
FIGS. 12, 13 and 14 illustrate tri-state bus circuits for illustrating the method of the present invention.
Figure 13:
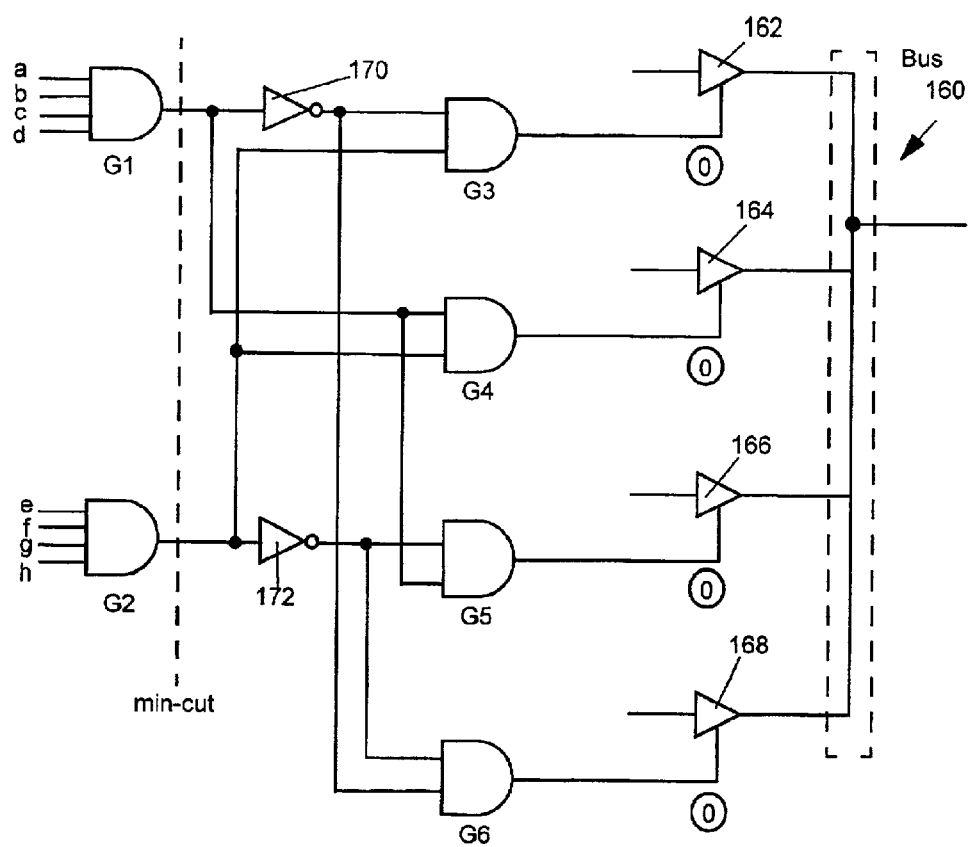
Figure 14:
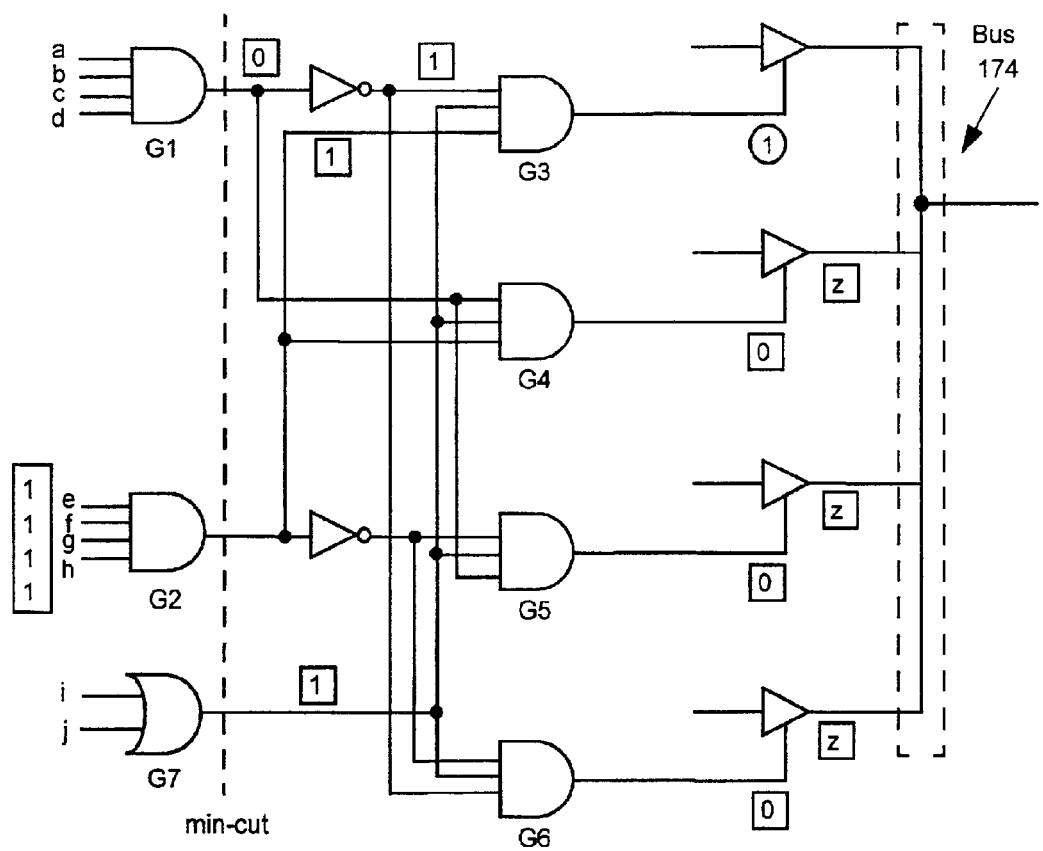

Reference will now be made to FIGS. 12–14 to describe a complete method as applied to a specific circuit. FIGS. 12 and 13 illustrate the same bus from the perspective of applying the implication based conflict-free and float-free analysis, respectively, and FIG. 14 illustrates a different bus circuit to illustrate the min-cut and full exhaustive analyses. The two buses are assumed to form part of the same circuit to be analyzed. It should also be understood that the analyses are performed on a model of the circuit such as an HDL description of the circuit and that the analysis is performed by a program product or software tool which is capable of reading and parsing the circuit description and tracing signals and logic values back and forth through the circuit and of providing results of the analyses to a printer, computer display and/or store the results in memory for later retrieval.

The first bus to be analyzed is bus 160 illustrated in FIG. 12. The bus includes four tri-state drivers 162, 164, 166 and 168 having an enable input controlled by 2-input AND gates G3, G4, G5 and G6, respectively. AND gates G1 and G2 provide input to AND gates G3, G4, G5 and G6, as shown.

The first analysis to be performed is the conflict-free implication analysis which comprises selecting each driver in sequence and, for each driver, assigning an enabling value to the control input of the driver, implying logic values to signals which control the enable input and then determining whether an implication conflict or a bus conflict exists.

Considering driver 162, a logic 1 on its enable input implies a logic 1 on the two inputs of G3; a logic 0 on the input to inverter 170; a logic 0 and logic 1 on the inputs of G4; a logic 0 on the output of G4; a logic 1 on the input of inverter 172, a logic 0 on both inputs of G5, and therefore a logic 0 on the output of G5; and a logic 1 and a logic 0 on the inputs of G6 and a logic 0 on its output. The result of this analysis are that, first, no implication conflicts were encountered in this implication process and, second, there are no bus conflicts in that there is only one active enable input and all of the other enable inputs are inactive.

A similar analysis performed on each of drivers 164, 166 and 168 reveals the same results. Accordingly, the bus is designated as conflict-free. It will be seen that, in this case, it was not necessary to consider inputs of G1 and G2. With each of G1 and G2 having four inputs, the complexity of the analysis would have increased very quickly.

The next step in the analysis of bus 160 is to perform an implication based float-free analysis in which a disable value is assigned to the enable input of all of the drivers 162, 164, 166 and 168 of the bus. Referring to FIG. 13, implication-based floating-free identification is inconclusive. When a logic 0 is assigned on the output of G3, G3 is evaluated as follows. If G3 fans out to more than one gate, the other gates to which it fans out are evaluated to determine whether the logic 0 propagates forward. In this case, G3 has no other fanout. Next, G3 is evaluated to determine whether the logic 0 on its output implies a value on any of its inputs. In this case, it does not—the zero on the output of G3 could result from either of its inputs being zero. Since more than one solution is possible, nothing more can be implied. Thus, the implication-based float-free identification of bus 160 is inconclusive because it does not lead to an implication conflict. Similarly, the assignment of logic 0's to G4, G5 and G6 does not imply any other values in the circuit.

Since the implication-based float-free analysis does not reveal an implication conflict, then, according to step 82 in FIG. 2, a min-cut exhaustive analysis is performed according to the procedure outlined in FIG. 3. Using an appropriate procedure, a min-cut set is identified as comprising {G1, G2}. Thus, the input set to be used for the analysis are the outputs of the min-cut set elements and indicated by the nets which intersect the min-cut dotted line in FIG. 13. Different combinations of logic values are assigned to these inputs until either a bus conflict or floating condition is determined or all combinations have been tried. In FIG. 13, the logic values are propagated forward through G3, G4, G5 and G6 to the enable inputs of the bus drivers and the outputs of the outputs of the drivers are evaluated to determine whether bus conflict or floating condition results from the logic values. The logic values may be generated by a random pattern generator, well known in the art. Exhaustive simulation on the {G1, G2} min-cut would show that all combinations to be non-floating. The bus is then classified as conflict-free and float-free, with no need to perform a full exhaustive analysis of the bus. This concludes the analysis of bus 160 and the next bus is selected for analysis, in this case, bus 174 shown in FIG. 14.

An implication-based conflict-free analysis, similar to that described above with reference to FIG. 13, performed on the bus 174 in FIG. 14 would pass and, as in the example in FIG. 13, an implication-based floating-free analysis would be inconclusive. A min-cut exhaustive simulation on the min-cut set of {G1, G2, G7} would reveal combinations of logic values that result in the bus floating. Specifically, the combinations are any combination that has the output of G7 set to logic 0. Accordingly, according to step 130 of FIG. 3, a full exhaustive analysis would be performed. The analysis would reveal input logic combinations that have inputs i and j of G7 set to logic 0 result in a bus floating condition. The bus is then classified as not floating-free in step 142 of FIG. 4.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A method of verifying a logic design for proper operation of tri-state buses specified in the design, the method comprising:

for each bus in the circuit design, performing an exhaustive analysis on a min-cut set of logic controlling the bus and designating each said bus as either conclusively conflict-free and float-free or as inconclusive.

2. A method as defined in claim 1, further including performing a full exhaustive analysis of the bus when the exhaustive analysis on the min-cut set of logic is inconclusive.

3. A method as defined in claim 2, said full exhaustive analysis comprising:
determining the inputs of the logic cone of the select inputs of the tri-state gates of the bus under test;
for each of a plurality of combinations of logic values:
assigning the combination of logic values to said inputs of said logic cone;
forward simulating said logic values from said logic cone inputs to the select inputs of each tri-state gate of the bus under test so as to determine the input of each said tri-state gate to said bus;
determining whether a bus-conflict or a floating bus condition exists;
designating said bus as a conflict bus when a bus-conflict or floating bus condition exists;
designating said bus as a conflict-free and float-free bus when no bus-conflict or floating bus condition has been determined after evaluating all of said plurality of combinations of logic values.

4. A method as defined in claim 3, said assigning the combination of logic values including generating a random set of logic values.

5. A method as defined in claim 3, said forward simulating including performing a parallel application of said combinations of logic values in which multiple combinations are evaluated simultaneously by using each bit of an integer to store one combination.

6. A method as defined in claim 1, said performing an exhaustive analysis on a min-cut set further including:
determining a min-cut set of logic elements having the smallest size, said min-cut set being a cut-set of logic elements which separates the control logic cone of the bus into two parts in which all paths between a logic element in one part and a logic element in the other part pass through an element in the min cut-set of logic elements;
determining the inputs of the min-cut set of logic elements;
for each of a plurality of combinations of logic values:
assigning the combination of logic values to the inputs of the min-cut set of logic elements;
forward simulating the logic values from said inputs to the select inputs of each tri-state gate of the bus under test so as to determine the input of each said tri-state to said bus;
determining whether a bus-conflict or a floating bus condition exists; and
designating said min-cut set exhaustive analysis as inconclusive when a conflict or floating condition exists and
designating said bus as conflict-free and float-free when no conflict condition has been determined after all of said plurality of combinations of logic values have been evaluated.

7. A method as defined in claim 6 said assigning the combination of logic values including generating a random set of logic values.

8. A method as defined in claim 1, further including performing pre-analysis processing comprising:
identifying all buses in said circuit design; and
arranging identified buses in sorted list for processing in which buses in the fan-in of other buses appear earlier in the list than the other buses.

9. A method as defined in claim 8, said pre-analysis processing including mapping any non-scanned pipeline flops as buffers before analyzing the buses.

10. A method as defined in claim 8, said pre-processing including:
applying constant logic values on one or more inputs of said circuit, including assigning and propagating said constant logic values; and
maintaining constant throughout said analyses said constant logic values and logic values resulting from said propagating.

11. A method as defined in claim 1, further including, prior to performing an exhaustive analysis on a min-cut set of logic controlling the bus:
performing an implication based conflict-free analysis on said bus to determine whether said bus is conflict-free;
performing an implication based floating-free analysis on said bus to determine whether said bus is floating-free; and
designating said bus as a no-conflict bus when said bus is determined to be conflict-free and floating free and selecting a next bus in sequence for analysis.

12. A method as defined in claim 11, said performing an implication based conflict-free analysis on said bus to determine whether said bus is conflict-free, comprising:
for each input of the bus:
implying logic values to signals which control the control input of the tri-state gate associated with said each input so as to produce an enabling control value;
determining whether said implying logic values results in an implication conflict;
when an implication conflict exists, selecting another of said inputs and repeating said implying and determining steps;
when an implication conflict does not exist, determining whether said implying logic values results in a bus conflict;
terminating said implication based conflict-free analysis and performing a full exhaustive analysis when a bus conflict is determined;
determining whether all other inputs to said bus are in a high impedance state and, if not, terminating said implication based conflict-free analysis and performing an exhaustive analysis on a min-cut set of logic controlling the bus; and
designating said bus as conclusively conflict-free when each said implying logic values resulted in either an implication conflict all other inputs to said bus being in a high impedance state.

13. A method as defined in claim 11, said performing an implication based floating-free analysis on said bus to determine whether said bus is floating-free, comprising:
implying logic values to signals which control the control input of each tri-state gate associated with said bus so as to produce disabling control value on the control inputs of said gates;
determining whether said implying logic values results in an implication conflict;
terminating said implication based floating-free analysis and performing an exhaustive analysis on a min-cut set of logic controlling the bus when no implication conflict is determined; and designating said bus as floating-free when an implication conflict is determined.

14. A method as defined in claim 13, said performing an implication based conflict-free analysis on said bus to determine whether said bus is conflict-free, comprising:
for each input of said bus which is controlled by a tri-state gate having a select input;
initializing the circuit to unknown values;
assigning an enabling value to the select input of the bus;
implying logic values to inputs to said gate needed to produce an enabling value;
determining whether said implying logic values results in an implication conflict and selecting a next input for analysis when an implication conflict is detected;
determining whether a bus conflict exists at the inputs of said bus and performing a full exhaustive analysis of said bus when a bus conflict exists;
when no bus-conflict exists,
determining whether all other inputs of said bus are in a high-impedance state and, if not, performing said exhaustive analysis on a min-cut set of logic controlling the bus, and, if so, selecting a next input for analysis; and
designating said bus as conclusively conflict-free when each said implying logic values resulted in either an implication conflict all other inputs to said bus being in a high impedance state.

15. A method of verifying a logic design for proper operation of tri-state buses specified in the design, the method comprising:
identifying all buses in said circuit design;
arranging identified buses in a sorted list for processing in which buses in the fan-in of other buses appear earlier in the list than the other buses; and
for each bus in said list:
performing an exhaustive analysis on a min-cut set of logic controlling the bus, said performing an exhaustive analysis on a min-cut set further including:
determining a min-cut set of logic elements having the smallest size, said min-cut set being a cut-set of logic elements which separates the control logic cone of the bus into two parts in which all paths between a logic element in one part and a logic element in the other part pass through an element in the min-cut set of logic elements;
determining the inputs of the min-cut set of logic elements; and
for each of a plurality of combinations of logic values:
assigning the combination of logic values to the inputs of said min-cut set of logic elements;
forward simulating the logic values from said inputs to the select inputs of each tri-state gate of the bus under test so as to determine the input of each said tri-state to said bus;
determining whether a bus-conflict or a floating bus condition exists; and, if so, designating said min-cut set exhaustive analysis as inconclusive and performing a full exhaustive analysis of the bus; and
designating said bus as conflict free and float-free when no conflict conditions have been determined after evaluating all of said combinations of logic values.

16. A method as defined in claim 15, said forward simulating including performing a parallel application of said combinations of logic values in which multiple combinations are evaluated simultaneously by using each bit of an integer to store one combination.

17. A method as defined in claim 15, said full exhaustive analysis comprising:
determining the inputs of the logic cone of the select inputs of the tri-state gates of the bus under test;
for each of a plurality of combinations of logic values:
assigning the combination of logic values to said inputs of the logic cone;
forward simulating the logic values from said logic cone inputs to the select inputs of each tri-state gate of the bus under test so as to determine the input logic value of each said tri-state gate to said bus;
determining whether a bus-conflict or a floating bus condition exists;
designating said bus as a conflict bus when a conflict or floating condition exists;
designating said bus as a conflict-free and float-free bus when no bus-conflict or floating condition has been determined after evaluating all of said plurality of combinations of logic values.

18. A method as defined in claim 17, said forward simulating including performing a parallel application of said combinations of logic values in which multiple combinations are evaluated simultaneously by using each bit of an integer to store one combination.

19. A method of verifying a logic design for proper operation of tri-state buses specified in the design, the method comprising, for each bus in the circuit design:
performing an implication based conflict-free analysis on said each bus to determine whether said bus is conflict-free;
performing an implication based floating-free analysis on said bus to determine whether said bus is floating-free; and
designating said bus as a no-conflict bus when said each bus is determined to be conflict-free and floating free; and
performing an exhaustive analysis of the bus when either of said implication based analyses is inconclusive.

20. A method as defined in claim 19, said performing an implication based conflict-free analysis on said bus to determine whether said bus is conflict-free, comprising:
for each input of the bus:
implying logic values to signals which control the control input of the tri-state gate associated with said each input so as to produce an enabling control value;
determining whether said implying logic values results in an implication conflict;
when an implication conflict exists, selecting another of said inputs and repeating said implying and determining steps;
when an implication conflict does not exist, determining whether said implying logic values results in a bus conflict and terminating said implication based conflict-free analysis and performing a full exhaustive analysis when a bus conflict is determined;
determining whether all other inputs to said bus are in a high impedance state and, if not, terminating said implication based conflict-free analysis and performing an exhaustive analysis on a min-cut set of logic controlling the bus; and
designating said bus as conclusively conflict-free when each said implying logic values resulted in either an implication conflict all other inputs to said bus being in a high impedance state.

21. A method as defined in claim 20, said performing an implication based, floating-free analysis on said bus to determine whether said bus is floating-free, comprising:
  implying logic values to signals which control the control input of each tri-state gate associated with said bus so as to produce disabling control value on the control inputs of said gates;
  determining whether said implying logic values produces an implication conflict;
  terminating said implication based floating-free analysis and performing an exhaustive analysis on a min-cut set of logic controlling the bus when no implication conflict is determined; and
  designating said bus as floating-free when an implication conflict is determined.

22. A method as defined in claim 19, said performing an implication based, floating-free analysis on said bus to determine whether said bus is floating-free, comprising:
  implying logic values to signals which control the control input of each tri-state gate associated with said bus so as to produce disabling control value on the control inputs of said gates;
  determining whether said implying logic values produces an implication conflict;
  terminating said implication based floating-free analysis and performing an exhaustive analysis on said bus when no implication conflict is determined; and
  designating said bus as floating-free when an implication conflict is determined.

23. A method as defined in claim 19, said exhaustive analysis including an exhaustive analysis on a min-cut set of logic controlling the bus.

24. A method as defined in claim 23, said exhaustive analysis on a min-cut set including:
  determining a min-cut set of logic elements having the smallest size, said min-cut set being a cut-set of logic elements which separates the control logic cone of the bus into two parts in which all paths between a logic element in one part and a logic element in the other part pass through an element in the min cut-set of logic elements;
  determining the inputs of the min-cut set of logic elements;
  for each of a plurality of combinations of logic values:
    assigning the combination of logic values to the inputs of the min-cut set of logic elements;
    forward simulating the logic values from said inputs to the select inputs of each tri-state gate of the bus under test so as to determine the input of each said tri-state to said bus;
    determining whether a bus-conflict or a floating bus condition exists; and
      designating said min-cut set exhaustive analysis as inconclusive when a when a conflict or floating condition exists and
  designating said bus as conflict-free and float-free when no conflict condition has been determined after all of said plurality of combinations of logic values have been evaluated.

25. A method as defined in claim 24, said forward simulating including performing a parallel application of said combinations of logic values in which multiple combinations are evaluated simultaneously by using each bit of an integer to store one combination.

26. A method as defined in claim 23, said exhaustive analysis being a full exhaustive analysis including:
  determining the inputs of the logic cone of the select inputs of the tri-state gates of the bus under test;
  for each of a plurality of combinations of logic values:
    assigning the combination of logic values to said inputs of the logic cone;
    forward simulating the logic values from said logic cone inputs to the select inputs of each tri-state gate of the bus under test so as to determine the input of each said tri-state gate to said bus;
    determining whether a bus-conflict or a floating bus condition exists; and
  designating said bus as having a no conflict bus when no conflict or floating condition exists and designating said bus as a conflict bus when a conflict or floating condition exists.

27. A method of verifying a logic design for proper operation of tri-state buses specified in the design, the method comprising, for each bus in the circuit design:
  performing an implication based conflict-free analysis on said each bus to determine whether said bus is conflict-free;
  performing an implication based floating-free analysis on said bus to determine whether said bus is floating-free; and
  designating said bus as a no-conflict bus when said bus is determined to be conflict-free and floating-free and performing an exhaustive analysis of the bus when either of said implication based analyses is inconclusive.

28. A method as defined in claim 27, said performing an exhaustive analysis including an exhaustive analysis on a min-cut set of logic controlling the bus.

29. A method as defined in claim 28, said performing an exhaustive analysis including performing a full exhaustive analysis of the bus when the exhaustive analysis on the min-cut set of logic is inconclusive.

30. A method as defined in claim 29, said exhaustive analysis on a min-cut set including:
  determining a min-cut set of logic elements having the smallest size, said min-cut set being a cut-set of logic elements which separates the control logic cone of the bus into two parts in which all paths between a logic element in one part and a logic element in the other part pass through an element in the min cut-set of logic elements;
  determining the inputs of the min-cut set of logic elements;
  for each of a plurality of combinations of logic values:
    assigning the combination of logic values to the inputs of the min-cut set of logic elements;
    forward simulating the logic values from said inputs to the select inputs of each tri-state gate of the bus under test so as to determine the input of each said tri-state to said bus;
    determining whether a bus-conflict or a floating bus condition exists; and
      designating said min-cut set exhaustive analysis as inconclusive when a when a conflict or floating condition exists and
  designating said bus as conflict-free and float-free when no conflict condition has been determined after all of said plurality of combinations of logic values have been evaluated.

31. A method as defined in claim 30, said performing an implication based conflict-free analysis on said bus to determine whether said bus is conflict-free comprising:

for each input of the bus:
implying logic values to signals which control the control input of the tri-state gate associated with said each input so as to produce an enabling control value;
determining whether said implying logic values results in an implication conflict;
when an implication conflict exists, selecting another of said inputs and repeating said implying and determining steps;
when an implication conflict does not exist, determining whether said implying logic values results in a bus conflict;
terminating said implication based conflict-free analysis and performing a full exhaustive analysis when a bus conflict is determined;
determining whether all other inputs to said bus are in a high impedance state and, if not, terminating said implication based conflict-free analysis and performing said exhaustive analysis on a min-cut set of logic controlling the bus; and
designating said bus as conclusively conflict-free when each said implying logic values resulted in either an implication conflict all other inputs to said bus being in a high impedance state.

32. A method as defined in claim 31, said performing an implication based floating-free analysis on said bus to determine whether said bus is floating-free comprising:
initializing the circuit to unknown values;
implying logic values to signals which control the control input of each tri-state gate associated with said bus so as to produce disabling control value on the control inputs of said gates;
determining whether said implying logic values produces an implication conflict;
terminating said implication based floating-free analysis and performing an exhaustive analysis on a min-cut set of logic controlling the bus when no implication conflict is determined; and
designating said bus as floating-free when an implication conflict is determined.

33. A method as defined in claim 32, said full exhaustive analysis including:
determining the inputs of the logic cone of the select inputs of the tri-state gates of the bus under test;
for each of a plurality of combinations of logic values:
assigning the combination of logic values to said inputs of the logic cone;
forward simulating the logic values from said logic cone inputs to the select inputs of each tri-state gate of the bus under test so as to determine the input of each said tri-state gate to said bus;
determining whether a bus-conflict or a floating bus condition exists;
designating said bus as a conflict bus when a conflict or floating condition exists;
designating said bus as a conflict-free and float-free bus when no bus-conflict or floating condition has been determined after evaluating all of said plurality of combinations of logic values.

34. A method as defined in claim 33, said assigning the combination of logic values including generating a random set of logic values.

35. A method as defined in claim 34, further including performing pre-analysis processing comprising:
identifying all buses in said circuit design; and
arranging identified buses in sorted list for processing in which buses in the fan-in of other buses appear earlier in the list than the other buses.

36. A method as defined in claim 35, said pre-analysis processing including mapping any non-scanned pipeline flops as buffers before analyzing the buses.

37. A method as defined in claim 36, said forward simulating including performing a parallel application of said combinations of logic values in which multiple combinations are evaluated simultaneously by using each bit of an integer to store one combination.

38. A method as defined in claim 37, said pre-processing including:
applying of constant logic values on one or more inputs of said circuit, including assigning and propagating said constant logic values; and
maintaining constant throughout said analyses said constant logic values and logic values resulting from said propagating.

39. A program product for use in verifying a circuit logic design for proper operation of tri-state buses specified in the design, the program product comprising:
a computer readable storage medium;
means recorded on the medium for, for each bus in the circuit design, performing an exhaustive analysis on a min-cut set of logic controlling the bus and designating each said bus as either conclusively conflict-fee and float-free or as inconclusive.

40. A program product as defined in claim 39, further including means recorded on said medium for performing a full exhaustive analysis of the bus when the exhaustive analysis on the min-cut set of logic is inconclusive.

41. A program product as defined in claim 40, said full exhaustive analysis comprising:
means recorded on said medium for determining the inputs of the logic cone of the select inputs of the tri-state gates of the bus under test;
means recorded on said medium for, for each of a plurality of combinations of logic values:
means recorded on said medium for assigning the combination of logic values to said inputs of said logic cone;
means recorded on said medium for forward simulating said logic values from said logic cone inputs to the select inputs of each tri-state gate of the bus under test so as to determine the input of each said tri-state gate to said bus;
means recorded on said medium for determining whether a bus-conflict or a floating bus condition exists;
means recorded on said medium for designating said bus as a conflict bus when a bus-conflict or floating bus condition exists;
means recorded on said medium for designating said bus as a conflict-free and float-free bus when no bus-conflict or floating bus condition has been determined after evaluating all of said plurality of combinations of logic values.

42. A program product as defined in claim 41, said means for assigning the combination of logic values including means recorded on said medium for generating a random set of logic values.

43. A program product as defined in claim 39, said means for performing an exhaustive analysis on a min-cut set further including:
means recorded on the medium for determining a min-cut set of logic elements having the smallest size, said min-cut set being a cut-set of logic elements which separates the control logic cone of the bus into two parts in which all paths between a logic element in one part and a logic element in the other part pass through an element in the min cut-set of logic elements;

means recorded on the medium for determining the inputs of the min-cut set of logic elements;

means recorded on the medium for, for each of a plurality of combinations of logic values:

assigning the combination of logic values to the inputs of the min-cut set of logic elements;

forward simulating the logic values from said inputs to the select inputs of each tri-state gate of the bus under test so as to determine the input of each said tri-state to said bus;

determining whether a bus-conflict or a floating bus condition exists; and designating said min-cut set exhaustive analysis as inconclusive when a conflict or floating condition exists and means recorded on said medium for designating said bus as conflict-free and float-free when no conflict condition has been determined after all of said plurality of combinations of logic values have been evaluated.

44. A program product as defined in claim 43 said means for assigning the combination of logic values including means recorded on said medium for generating a random set of logic values.

45. A program product as defined in claim 43, said means for forward simulating including performing a parallel application of said combinations of logic values in which multiple combinations are evaluated simultaneously by using each bit of an integer to store one combination.

46. A program product as defined in claim 39, further including means recorded on said medium for performing pre-analysis processing comprising:

means recorded on said medium for identifying all buses in said circuit design; and arranging identified buses in sorted list for processing in which buses in the fan-in of other buses appear earlier in the list than the other buses.

47. A program product as defined in claim 46, said means for performing pre-analysis processing including means recorded on said medium for mapping any non-scanned pipeline flops as buffers before analyzing the buses.

48. A program product as defined in claim 46, said means for performing pre-processing including:

means recorded on said medium for applying constant logic values on one or more inputs of said circuit, including assigning and propagating said constant logic values; and means recorded on said medium for maintaining constant throughout said analyses said constant logic values and logic values resulting from said propagating.

49. A program product as defined in claim 39, further including, prior to performing an exhaustive analysis on a min-cut set of logic controlling the bus:

means recorded on said medium for performing an implication based conflict-free analysis on said bus to determine whether said bus is conflict-free;

means recorded on said medium for performing an implication based floating-free analysis on said bus to determine whether said bus is floating-free; and means recorded on said medium for designating said bus as a no-conflict bus when said bus is determined to be conflict-free and floating free and selecting a next bus in sequence for analysis.

50. A program product as defined in claim 49, said means for performing an implication based conflict-free analysis on said bus to determine whether said bus is conflict-free, comprising:

means recorded on said medium for implying logic values to signals which control the control input of the tri-state gate associated with said each input so as to produce an enabling control value;

means recorded on said medium for determining whether said implying logic values results in an implication conflict;

when an implication conflict exists, selecting another of said inputs and repeating said means for implying and said means for determining;

when an implication conflict does not exist, determining whether said implying logic values results in a bus conflict;

terminating said implication based conflict-free analysis and performing a full exhaustive analysis when a bus conflict is determined;

means recorded on said medium for determining whether all other inputs to said bus are in a high impedance state and, if not, terminating said implication based conflict-free analysis and performing an exhaustive analysis on a min-cut set of logic controlling the bus; and means recorded on said medium for designating said bus as being conflict-free when an implication conflict has been detected and as a bus conflict when an implication conflict has not been detected on said inputs of said bus.

51. A program product as defined in claim 49, said means for performing an implication based floating-free analysis on said bus to determine whether said bus is floating-free, comprising:

means recorded on said medium for implying logic values to signals which control the control input of each tri-state gate associated with said bus so as to produce disabling control value on the control inputs of said gates;

means recorded on said medium for determining whether said implying logic values results in an implication conflict;

terminating said implication based floating-free analysis and performing an exhaustive analysis on a min-cut set of logic controlling the bus when no implication conflict is determined; and means recorded on said medium for designating said bus as floating-free when an implication conflict is determined.

52. A program product as defined in claim 49, said means for performing an implication based conflict-free analysis on said bus to determine whether said bus is conflict-free, comprising:

means recorded on said medium for, for each input of said bus which is controlled by a tri-state gate having a select input;

initializing the circuit to unknown values;

assigning an enabling value to the select input of the bus;

implying logic values to inputs to said gate needed to produce an enabling value;

determining whether said implying logic values results in an implication conflict and selecting a next input for analysis when an implication conflict is detected;

determining whether a bus conflict exists at the inputs of said bus and performing a full exhaustive analysis of said bus when a bus conflict exists;

when no bus-conflict exists:
  determining whether all other inputs of said bus are in a high-impedance state and, if not, performing said exhaustive analysis on a min-cut set of logic controlling the bus, and, if so, selecting a next input for analysis; and
means recorded on said medium for designating said bus as conclusively conflict-free when each said implying logic values resulted in either an implication conflict all other inputs to said bus being in a high impedance state.

53. A program product for use in verifying a logic design for proper operation of tri-state buses specified in the design, the program product comprising:
  a computer readable storage medium;
  means recorded on said medium for identifying all buses in said circuit design;
  means recorded on said medium for arranging identified buses in a sorted list for processing in which buses in the fan-in of other buses appear earlier in the list than the other buses; and
  means recorded on said medium for performing an exhaustive analysis on a min-cut set of logic controlling the bus, said means for performing an exhaustive analysis on a min-cut set further including:
    means recorded on said medium for determining a min-cut set of logic elements having the smallest size, said min-cut set being a cut-set of logic elements which separates the control logic cone of the bus into two parts in which all paths between a logic element in one part and a logic element in the other part pass through an element in the min cut-set of logic elements;
    means recorded on said medium for determining the inputs of the min-cut set of logic elements; and
    means recorded on said medium for, for each of a plurality of combinations of logic values:
      assigning the combination of logic values to the inputs of said min-cut set of logic elements;
      forward simulating the logic values from said inputs to the select inputs of each tri-state gate of the bus under test so as to determine the input of each said tri-state gate to said bus;
      determining whether a bus-conflict or a floating bus condition exists; and, if so, designating said min-cut set exhaustive analysis as inconclusive and performing a full exhaustive analysis of the bus;
    means recorded on said medium for designating said bus as conflict free and float-free when no conflict conditions have been determined after evaluating all of said combinations of logic values.

54. A program product as defined in claim 53, said means for forward simulating including means recorded on said medium for performing a parallel application of said combinations of logic values in which multiple combinations are evaluated simultaneously by using each bit of an integer to store one combination.

55. A program product as defined in claim 53, said means for performing a full exhaustive analysis comprising:
  means recorded on said medium for determining the inputs of the logic cone of the select inputs of the tri-state gates of the bus under test;
  means recorded on said medium for, for each of a plurality of combinations of logic values:
    assigning the combination of logic values to said inputs of the logic cone;
    forward simulating the logic values from said logic cone inputs to the select inputs of each tri-state gate of the bus under test so as to determine the input of each said tri-state gate to said bus;
    determining whether a bus-conflict or a floating bus condition exists;
    designating said bus as a conflict bus when a conflict or floating condition exists;
  means recorded on said medium for designating said bus as a conflict-free and float-free bus when no bus-conflict or floating condition has been determined after evaluating all of said plurality of combinations of logic values.

56. A program product as defined in claim 55, said means for forward simulating including means recorded on said medium for performing a parallel application of said combinations of logic values in which multiple combinations are evaluated simultaneously by using each bit of an integer to store one combination.

57. A program product for use in verifying a logic design for proper operation of tri-state buses specified in the design, the program product comprising:
  means recorded on said medium for performing an implication based conflict-free analysis on said each bus to determine whether said bus is conflict-free;
  means recorded on said medium for performing an implication based floating-free analysis on said bus to determine whether said bus is floating-free;
  means recorded on said medium for designating said bus as a no-conflict bus when said each bus is determined to be conflict-free and floating free; and
  means recorded on said medium for performing an exhaustive analysis of the bus when either of said implication based analyses is inconclusive.

58. A program product as defined in claim 57, said means for performing an implication based conflict-free analysis on said bus to determine whether said bus is conflict-free, comprising:
  means recorded on said medium for, for each input of the bus:
    implying logic values to signals which control the control input of the tri-state gate associated with said each input so as to produce an enabling control value;
    determining whether said implying logic values results in an implication conflict;
    when an implication conflict exists, selecting another of said inputs and repeating said implying and determining steps;
    when an implication conflict does not exist, determining whether said implying logic values results in a bus conflict and terminating said implication based conflict-free analysis and performing a full exhaustive analysis when a bus conflict is determined;
    determining whether all other inputs to said bus are in a high impedance state and, if not, terminating said implication based conflict-free analysis and performing an exhaustive analysis on a min-cut set of logic controlling the bus; and
  means recorded on said medium for designating said bus as conclusively conflict-free when each said implying logic values resulted in either an implication conflict all other inputs to said bus being in a high impedance state.

59. A program product as defined in claim 58, said means for performing an implication based, floating-free analysis on said bus to determine whether said bus is floating-free, comprising:

means recorded on said medium for implying logic values to signals which control the control input of each tri-state gate associated with said bus so as to produce disabling control value on the control inputs of said gates;

means recorded on said medium for determining whether said implying logic values produces an implication conflict;

means recorded on said medium for terminating said implication based floating-free analysis and performing an exhaustive analysis on a min-cut set of logic controlling the bus when no implication conflict is determined; and means recorded on said medium for designating said bus as floating-free when an implication conflict is determined.

60. A program product as defined in claim 57, said means for performing an implication based, floating-free analysis on said bus to determine whether said bus is floating-free, comprising:

means recorded on said medium for implying logic values to signals which control the control input of each tri-state gate associated with said bus so as to produce disabling control value on the control inputs of said gates;

means recorded on said medium for determining whether said implying logic values produces an implication conflict;

means recorded on said medium for terminating said implication based floating-free analysis and performing an exhaustive analysis on said bus when no implication conflict is determined; and means recorded on said medium for designating said bus as floating-free when an implication conflict is determined.

61. A program product as defined in claim 57, said means for performing an exhaustive analysis including means recorded on said medium for performing an exhaustive analysis on a min-cut set of logic controlling the bus.

62. A program product as defined in claim 61, said means for performing an exhaustive analysis on a min-cut set including:

means recorded on said medium for determining a min-cut set of logic elements having the smallest size, said min-cut set being a cut-set of logic elements which separates the control logic cone of the bus into two parts in which all paths between a logic element in one part and a logic element in the other part pass through an element in the min cut-set of logic elements;

means recorded on said medium for determining the inputs of the min-cut set of logic elements;

means recorded on said medium for, for each of a plurality of combinations of logic values:

assigning the combination of logic values to the inputs of the min-cut set of logic elements;

forward simulating the logic values from said inputs to the select inputs of each tri-state gate of the bus under test so as to determine the input of each said tri-state to said bus;

determining whether a bus-conflict or a floating bus condition exists; and designating said min-cut set exhaustive analysis as inconclusive when a conflict condition exists and means recorded on said medium for designating said bus as conflict-free and float-free when no conflict condition has been determined after all of said plurality of combinations of logic values have been evaluated.

63. A program product as defined in claim 61, said means for forward simulating including means recorded on said medium for performing a parallel application of said combinations of logic values in which multiple combinations are evaluated simultaneously by using each bit of an integer to store one combination.

64. A program product as defined in claim 61, said means for performing an exhaustive analysis being a means for performing a full exhaustive analysis including:

means recorded on said medium for determining the inputs of the logic cone of the select inputs of the tri-state gates of the bus under test;

means recorded on said medium for, for each of a plurality of combinations of logic values:

assigning the combination of logic values to said inputs of the logic cone;

forward simulating the logic values from said logic cone inputs to the select inputs of each tri-state gate of the bus under test so as to determine the input of each said tri-state gate to said bus;

determining whether a bus-conflict or a floating bus condition exists; and designating said bus as having a no conflict bus when no conflict or floating condition exists and designating said bus as a conflict bus when a conflict or floating condition exists.

65. A program product for use in verifying a logic design for proper operation of tri-state buses specified in the design, the program product comprising, for each bus in the circuit design:

means recorded on said medium for performing an implication based conflict-free analysis on said each bus to determine whether said bus is conflict-free;

means recorded on said medium for performing an implication based floating-free analysis on said bus to determine whether said bus is floating-free; and means recorded on said medium for designating said bus as a no-conflict bus when said bus is determined to be conflict-free and floating-free and performing an exhaustive analysis of the bus when either of said implication based analyses is inconclusive.

66. A program product as defined in claim 65, said means for performing an exhaustive analysis including means recorded on said medium for performing an exhaustive analysis on a min-cut set of logic controlling the bus.

67. A program product as defined in claim 66, said means for performing an exhaustive analysis including means recorded on said medium for performing a full exhaustive analysis of the bus when the exhaustive analysis on the min-cut set of logic is inconclusive.

68. A program product as defined in claim 67, said means for performing an exhaustive analysis on a min-cut set including:

means recorded on said medium for determining a min-cut set of logic elements having the smallest size, said min-cut set being a cut-set of logic elements which separates the control logic cone of the bus into two parts in which all paths between a logic element in one part and a logic element in the other part pass through an element in the min cut-set of logic elements;

means recorded on said medium for determining the inputs of the min-cut set of logic elements;

means recorded on said medium for, for each of a plurality of combinations of logic values:

assigning the combination of logic values to the inputs of the min-cut set of logic elements;

forward simulating the logic values from said inputs to the select inputs of each tri-state gate of the bus under test so as to determine the input of each said tri-state to said bus;

determining whether a bus-conflict or a floating bus condition exists; and designating said min-cut set exhaustive analysis as inconclusive when a conflict or floating condition exists and designating said bus as conflict-free and float-free when no conflict condition has been determined after all of said plurality of combinations of logic values have been evaluated.

69. A program product as defined in claim 68, said means for performing an implication based conflict-free analysis on said bus to determine whether said bus is conflict-free comprising:

means recorded on said medium for, for each input of the bus:

implying logic values to signals which control the control input of the tri-state gate associated with said each input so as to produce an enabling control value;

determining whether said implying logic values results in an implication conflict;

when an implication conflict exists, selecting another of said inputs and repeating said implying and determining steps;

when an implication conflict does not exist, determining whether said implying logic values results in a bus conflict;

terminating said implication based conflict-free analysis and performing a full exhaustive analysis when a bus conflict is determined;

determining whether all other inputs to said bus are in a high impedance state and, if not, terminating said implication based conflict-free analysis and performing said exhaustive analysis on a min-cut set of logic controlling the bus; and designating said bus as conclusively conflict-free when each said implying logic values resulted in either an implication conflict all other inputs to said bus being in a high impedance state.

70. A program product as defined in claim 69, said means for performing an implication based floating-free analysis on said bus to determine whether said bus is floating-free comprising:

means recorded on said medium for initializing the circuit to unknown values;

means recorded on said medium for implying logic values to signals which control the control input of each tri-state gate associated with said bus so as to produce disabling control value on the control inputs of said gates;

means recorded on said medium for determining whether said implying logic values produces an implication conflict;

means recorded on said medium for terminating said implication based floating-free analysis and performing an exhaustive analysis on a min-cut set of logic controlling the bus when no implication conflict is determined; and means recorded on said medium for designating said bus as floating-free when an implication conflict is determined.

71. A program product as defined in claim 70, said means for performing an full exhaustive analysis including:

means recorded on said medium for determining the inputs of the logic cone of the select inputs of the tri-state gates of the bus under test;

means recorded on said medium for, for each of a plurality of combinations of logic values:

assigning the combination of logic values to said inputs of the logic cone;

forward simulating the logic values from said logic cone inputs to the select inputs of each tri-state gate of the bus under test so as to determine the input of each said tri-state gate to said bus;

determining whether a bus-conflict or a floating bus condition exists;

designating said bus as a conflict bus when a conflict or floating condition exists;

designating said bus as a conflict-free and float-free bus when no bus-conflict or floating condition has been determined after evaluating all of said plurality of combinations of logic values.

72. A program product as defined in claim 71, said assigning the combination of logic values including generating a random set of logic values.

73. A program product as defined in claim 72, further including means recorded on said medium for performing pre-analysis processing comprising:

identifying all buses in said circuit design; and arranging identified buses in sorted list for processing in which buses in the fan-in of other buses appear earlier in the list than the other buses.

74. A program product as defined in claim 73, said pre-analysis processing including means recorded on said medium for mapping any non-scanned pipeline flops as buffers before analyzing the buses.

75. A program product as defined in claim 74, said forward simulating including means recorded on said medium for performing a parallel application of said combinations of logic values in which multiple combinations are evaluated simultaneously by using each bit of an integer to store one combination.

76. A program product as defined in claim 75, said means for pre-processing including:

means recorded on said medium for applying of constant logic values on one or more inputs of said circuit, including assigning and propagating said constant logic values; and means recorded on said medium for maintaining constant throughout said analyses said constant logic values and logic values resulting from said propagating.

* * * * *